US008688413B2

(12) United States Patent
Healey et al.

(10) Patent No.: US 8,688,413 B2
(45) Date of Patent: Apr. 1, 2014

(54) SYSTEM AND METHOD FOR SEQUENTIAL PLACEMENT OF COOLING RESOURCES WITHIN DATA CENTER LAYOUTS

(76) Inventors: Christopher M. Healey, Chelmsford, MA (US); Xuanhang Zhang, Tewksbury, MA (US)

( * ) Notice: Subject to any disclaimer, the term of this patent is extended or adjusted under 35 U.S.C. 154(b) by 404 days.

(21) Appl. No.: 12/982,838

(22) Filed: Dec. 30, 2010

(65) Prior Publication Data

US 2012/0170205 A1 Jul. 5, 2012

(51) Int. Cl.
*G06F 17/10* (2006.01)
*G06F 7/60* (2006.01)

(52) U.S. Cl.
USPC .......................................................... 703/2

(58) Field of Classification Search
USPC .......................................................... 703/2
See application file for complete search history.

(56) References Cited

U.S. PATENT DOCUMENTS

| | | |
|---|---|---|
| 3,317,798 A | 5/1967 | Chu et al. |
| 3,559,728 A | 2/1971 | Lyman et al. |
| 3,643,007 A | 2/1972 | Roberts et al. |
| 3,681,936 A | 8/1972 | Park |
| 3,742,725 A | 7/1973 | Berger |
| 3,995,446 A | 12/1976 | Eubank |
| 4,055,053 A | 10/1977 | Elfving et al. |
| 4,127,008 A | 11/1978 | Tyree, Jr. |
| 4,197,716 A | 4/1980 | Nussbaum |
| 4,223,535 A | 9/1980 | Kumm |
| 4,275,570 A | 6/1981 | Szymaszek et al. |

(Continued)

FOREIGN PATENT DOCUMENTS

| | | |
|---|---|---|
| CN | 2612211 Y | 4/2004 |
| DE | 102006041788 A1 | 3/2008 |

(Continued)

OTHER PUBLICATIONS

Saurabh K. Shrivastava, James W. VanGilder, Bahgat G. Sammakia, "Optimization of Cluster Cooling Performance for Data Centers" IEEE, 978-1-4244-1701-08/08 2008, pp. 1161-1166.*

(Continued)

*Primary Examiner* — Dwin M Craig
(74) *Attorney, Agent, or Firm* — Lando & Anastasi, LLP

(57) ABSTRACT

A computer-implemented method for sequential placement of cooling resources in a data center comprises: defining a weighted, higher-order cooling metric, $\hat{M}$, representing an overall performance of the cooling resources in the data center; enumerating all possible locations in the data center for placing an additional c cooling resources; and placing the c cooling resources in locations in the data center for which $\hat{M}$ is closest to an optimum value. For a performance metric $M_i$, the weighted, higher-order cooling performance metric can be defined as $$\hat{M} = \sum_{k=0}^{C-1} \sum_{i=1}^{R} a(i,k) M_i^{(k)},$$

where R represents a number of racks in the data center, C represents a total number of cooling resources placed in the data center, i represents one of the R racks in the data center, $M_i^{(k)}$ represents a value of metric $M_i$ when k cooling resources are shut down, and a(i,k) is a weighting function for rack i with the k cooling resources shut down. A system performing the method and computer-readable media having stored thereon instructions causing a processor to perform the method are also provided.

20 Claims, 6 Drawing Sheets

(56) References Cited

U.S. PATENT DOCUMENTS

| | | | |
|---|---|---|---|
| 4,285,205 | A | 8/1981 | Martin et al. |
| 4,419,865 | A | 12/1983 | Szymaszek |
| 4,515,746 | A | 5/1985 | Brun et al. |
| 4,599,873 | A | 7/1986 | Hyde |
| 4,696,168 | A | 9/1987 | Woods et al. |
| 4,774,631 | A | 9/1988 | Okuyama et al. |
| 4,823,290 | A | 4/1989 | Fasack et al. |
| 4,827,151 | A | 5/1989 | Okado |
| 4,827,733 | A | 5/1989 | Dinh |
| 4,837,663 | A | 6/1989 | Zushi et al. |
| 4,911,231 | A | 3/1990 | Horne et al. |
| 4,944,158 | A | 7/1990 | Akiike et al. |
| 4,962,734 | A | 10/1990 | Jorgensen |
| 5,057,968 | A | 10/1991 | Morrison |
| 5,095,712 | A | 3/1992 | Narreau |
| 5,150,580 | A | 9/1992 | Hyde |
| 5,153,837 | A | 10/1992 | Shaffer et al. |
| 5,158,132 | A | 10/1992 | Guillemot |
| 5,168,724 | A | 12/1992 | Gilbertson et al. |
| 5,173,819 | A | 12/1992 | Takahashi et al. |
| 5,177,666 | A | 1/1993 | Bland et al. |
| 5,181,653 | A | 1/1993 | Foster et al. |
| 5,216,623 | A | 6/1993 | Barrett et al. |
| 5,234,185 | A | 8/1993 | Hoffman et al. |
| 5,269,372 | A | 12/1993 | Chu et al. |
| 5,367,670 | A | 11/1994 | Ward et al. |
| 5,388,422 | A | 2/1995 | Hayashida et al. |
| 5,404,136 | A | 4/1995 | Marsden |
| 5,410,448 | A | 4/1995 | Barker, III et al. |
| 5,462,225 | A | 10/1995 | Massara et al. |
| 5,507,529 | A | 4/1996 | Martins |
| 5,528,507 | A | 6/1996 | McNamara et al. |
| 5,533,357 | A | 7/1996 | Voorhis |
| 5,581,478 | A | 12/1996 | Cruse et al. |
| 5,582,020 | A | 12/1996 | Scaringe et al. |
| 5,600,960 | A * | 2/1997 | Schwedler et al. ............ 62/99 |
| 5,649,428 | A | 7/1997 | Calton et al. |
| 5,657,641 | A | 8/1997 | Cunningham et al. |
| 5,682,949 | A | 11/1997 | Ratcliffe et al. |
| 5,694,780 | A | 12/1997 | Alsenz |
| 5,704,219 | A | 1/1998 | Suzuki et al. |
| 5,718,628 | A | 2/1998 | Nakazato et al. |
| 5,735,134 | A | 4/1998 | Liu et al. |
| 5,749,237 | A | 5/1998 | Sandofsky et al. |
| 5,794,897 | A | 8/1998 | Jobin et al. |
| 5,802,856 | A | 9/1998 | Schaper et al. |
| 5,850,539 | A | 12/1998 | Cook et al. |
| 5,860,280 | A | 1/1999 | Recine, Sr. et al. |
| 5,896,922 | A | 4/1999 | Chrysler et al. |
| 5,953,930 | A | 9/1999 | Chu et al. |
| 5,954,127 | A | 9/1999 | Chrysler et al. |
| 5,959,240 | A | 9/1999 | Yoshida et al. |
| 5,963,425 | A | 10/1999 | Chrysler et al. |
| 5,963,457 | A | 10/1999 | Kanoi et al. |
| 5,970,731 | A | 10/1999 | Hare et al. |
| 5,970,734 | A | 10/1999 | Stillwell et al. |
| 5,972,196 | A | 10/1999 | Murphy et al. |
| 5,978,594 | A | 11/1999 | Bonnell et al. |
| 5,987,614 | A | 11/1999 | Mitchell et al. |
| 5,995,729 | A | 11/1999 | Hirosawa et al. |
| 6,023,935 | A | 2/2000 | Okazaki et al. |
| 6,032,472 | A | 3/2000 | Heinrichs et al. |
| 6,034,872 | A | 3/2000 | Chrysler et al. |
| 6,038,879 | A | 3/2000 | Turcotte et al. |
| 6,055,480 | A | 4/2000 | Nevo et al. |
| 6,088,225 | A | 7/2000 | Parry et al. |
| 6,111,036 | A | 8/2000 | Wonders et al. |
| 6,134,511 | A | 10/2000 | Subbarao |
| 6,208,510 | B1 | 3/2001 | Trudeau et al. |
| 6,209,330 | B1 | 4/2001 | Timmerman et al. |
| 6,213,194 | B1 | 4/2001 | Chrysler et al. |
| 6,216,482 | B1 | 4/2001 | Xiao et al. |
| 6,216,956 | B1 | 4/2001 | Ehlers et al. |
| 6,223,810 | B1 | 5/2001 | Chu et al. |
| 6,237,353 | B1 | 5/2001 | Sishtla et al. |
| 6,246,969 | B1 | 6/2001 | Sinclair et al. |
| 6,276,161 | B1 | 8/2001 | Peiffer et al. |
| 6,305,180 | B1 | 10/2001 | Miller et al. |
| 6,332,335 | B1 | 12/2001 | Kajimoto et al. |
| 6,347,627 | B1 | 2/2002 | Frankie et al. |
| 6,374,627 | B1 | 4/2002 | Schumacher et al. |
| 6,415,628 | B1 | 7/2002 | Ahmed et al. |
| 6,438,978 | B1 | 8/2002 | Bessler |
| 6,457,076 | B1 | 9/2002 | Cheng et al. |
| 6,459,579 | B1 | 10/2002 | Farmer et al. |
| 6,474,087 | B1 | 11/2002 | Lifson |
| 6,483,730 | B2 | 11/2002 | Johnson, Jr. |
| 6,494,050 | B2 | 12/2002 | Spinazzola et al. |
| 6,557,624 | B1 | 5/2003 | Stahl et al. |
| 6,574,104 | B2 | 6/2003 | Patel et al. |
| 6,640,889 | B1 | 11/2003 | Harte et al. |
| 6,662,576 | B1 | 12/2003 | Bai |
| 6,668,565 | B1 | 12/2003 | Johnson et al. |
| 6,672,955 | B2 | 1/2004 | Charron |
| 6,682,100 | B2 | 1/2004 | Wood et al. |
| 6,694,759 | B1 | 2/2004 | Bash et al. |
| 6,695,577 | B1 | 2/2004 | Susek |
| 6,714,977 | B1 | 3/2004 | Fowler et al. |
| 6,718,277 | B2 | 4/2004 | Sharma |
| 6,718,781 | B2 | 4/2004 | Freund et al. |
| 6,721,672 | B2 | 4/2004 | Spitaels et al. |
| 6,745,579 | B2 | 6/2004 | Spinazzola et al. |
| 6,745,590 | B1 | 6/2004 | Johnson et al. |
| 6,761,212 | B2 | 7/2004 | DiPaolo |
| 6,775,137 | B2 | 8/2004 | Chu et al. |
| 6,795,928 | B2 | 9/2004 | Bradley et al. |
| 6,804,616 | B2 | 10/2004 | Bodas |
| 6,804,975 | B2 | 10/2004 | Park |
| 6,814,134 | B1 | 11/2004 | Pravda |
| 6,819,563 | B1 | 11/2004 | Chu et al. |
| 6,848,989 | B2 | 2/2005 | Miyazaki et al. |
| 6,859,366 | B2 | 2/2005 | Fink |
| 6,859,882 | B2 | 2/2005 | Fung |
| 6,862,179 | B2 | 3/2005 | Beitelmal et al. |
| 6,880,349 | B2 | 4/2005 | Johnson et al. |
| 6,881,142 | B1 | 4/2005 | Nair |
| 6,886,353 | B2 | 5/2005 | Patel et al. |
| 6,901,767 | B2 | 6/2005 | Wood |
| 6,924,981 | B2 | 8/2005 | Chu et al. |
| 6,927,980 | B2 | 8/2005 | Fukuda et al. |
| 6,955,058 | B2 | 10/2005 | Taras et al. |
| 6,964,539 | B2 | 11/2005 | Bradley et al. |
| 6,967,283 | B2 | 11/2005 | Rasmussen et al. |
| 6,967,841 | B1 | 11/2005 | Chu et al. |
| 6,973,797 | B2 | 12/2005 | Nemit, Jr. |
| 6,973,801 | B1 | 12/2005 | Campbell et al. |
| 6,980,433 | B2 | 12/2005 | Fink |
| 7,000,416 | B2 | 2/2006 | Hirooka et al. |
| 7,000,467 | B2 | 2/2006 | Chu et al. |
| 7,012,807 | B2 | 3/2006 | Chu et al. |
| 7,020,586 | B2 | 3/2006 | Snevely |
| 7,031,870 | B2 | 4/2006 | Sharma et al. |
| 7,032,119 | B2 | 4/2006 | Fung |
| 7,033,267 | B2 | 4/2006 | Rasmussen |
| 7,046,514 | B2 | 5/2006 | Fink et al. |
| 7,047,300 | B1 | 5/2006 | Oehrke et al. |
| 7,051,802 | B2 | 5/2006 | Baer |
| 7,051,946 | B2 | 5/2006 | Bash et al. |
| 7,085,133 | B2 | 8/2006 | Hall |
| 7,104,081 | B2 | 9/2006 | Chu et al. |
| 7,106,590 | B2 | 9/2006 | Chu et al. |
| 7,112,131 | B2 | 9/2006 | Rasmussen et al. |
| 7,120,021 | B2 | 10/2006 | Hamman |
| 7,120,689 | B2 | 10/2006 | Gonsalves et al. |
| 7,140,193 | B2 | 11/2006 | Johnson et al. |
| 7,145,772 | B2 | 12/2006 | Fink |
| 7,146,353 | B2 | 12/2006 | Garg et al. |
| 7,155,318 | B2 | 12/2006 | Sharma et al. |
| 7,165,412 | B1 | 1/2007 | Bean, Jr. |
| 7,173,820 | B2 | 2/2007 | Fink et al. |
| 7,184,269 | B2 | 2/2007 | Campbell et al. |
| 7,187,549 | B2 | 3/2007 | Teneketges et al. |
| 7,197,433 | B2 | 3/2007 | Patel et al. |
| 7,228,707 | B2 | 6/2007 | Lifson et al. |

(56) References Cited

U.S. PATENT DOCUMENTS

| | | | |
|---|---|---|---|
| 7,236,363 B2 | 6/2007 | Belady | |
| 7,251,547 B2 | 7/2007 | Bash et al. | |
| 7,254,307 B2 | 8/2007 | Xin | |
| 7,259,963 B2 | 8/2007 | Germagian et al. | |
| 7,270,174 B2 | 9/2007 | Chu et al. | |
| 7,272,005 B2 | 9/2007 | Campbell et al. | |
| 7,274,566 B2 | 9/2007 | Campbell et al. | |
| 7,284,379 B2 | 10/2007 | Pham et al. | |
| 7,298,617 B2 | 11/2007 | Campbell et al. | |
| 7,298,618 B2 | 11/2007 | Campbell et al. | |
| 7,313,503 B2 | 12/2007 | Nakagawa et al. | |
| 7,315,448 B1 | 1/2008 | Bash et al. | |
| 7,365,973 B2 | 4/2008 | Rasmussen et al. | |
| 7,366,632 B2 | 4/2008 | Hamann et al. | |
| 7,403,391 B2 | 7/2008 | Germagian et al. | |
| 7,406,839 B2 | 8/2008 | Bean et al. | |
| 7,418,825 B1 | 9/2008 | Bean, Jr. | |
| 7,426,453 B2 | 9/2008 | Patel et al. | |
| 7,472,043 B1 | 12/2008 | Low et al. | |
| 7,558,649 B1 | 7/2009 | Sharma et al. | |
| 7,568,360 B1 | 8/2009 | Bash et al. | |
| 7,596,476 B2 | 9/2009 | Rasmussen et al. | |
| 7,620,480 B2 | 11/2009 | Patel et al. | |
| 7,676,280 B1 | 3/2010 | Bash et al. | |
| 7,681,404 B2 | 3/2010 | Bean, Jr. | |
| 7,726,144 B2 | 6/2010 | Larson et al. | |
| 7,775,055 B2 | 8/2010 | Bean et al. | |
| 7,881,910 B2 | 2/2011 | Rasmussen et al. | |
| 7,885,795 B2 | 2/2011 | Rasmussen et al. | |
| 7,908,126 B2 | 3/2011 | Bahel et al. | |
| 7,975,156 B2 | 7/2011 | Artman et al. | |
| 7,979,250 B2 | 7/2011 | Archibald et al. | |
| 7,991,592 B2 | 8/2011 | VanGilder et al. | |
| 8,155,922 B2 | 4/2012 | Loucks | |
| 8,219,362 B2 | 7/2012 | Shrivastava et al. | |
| 8,229,713 B2 | 7/2012 | Hamann et al. | |
| 8,244,502 B2 | 8/2012 | Hamann et al. | |
| 8,249,825 B2 | 8/2012 | VanGilder et al. | |
| 8,315,841 B2 | 11/2012 | Rasmussen et al. | |
| 8,425,287 B2 | 4/2013 | Wexler | |
| 8,473,265 B2 | 6/2013 | Hlasny et al. | |
| 8,509,959 B2 | 8/2013 | Zhang et al. | |
| 2001/0042616 A1 | 11/2001 | Baer | |
| 2002/0004912 A1 | 1/2002 | Fung | |
| 2002/0059804 A1 | 5/2002 | Spinazzola et al. | |
| 2002/0062454 A1 | 5/2002 | Fung | |
| 2002/0072868 A1 | 6/2002 | Bartone et al. | |
| 2002/0134096 A1 | 9/2002 | Shim et al. | |
| 2002/0134567 A1 | 9/2002 | Rasmussen et al. | |
| 2002/0149911 A1 | 10/2002 | Bishop et al. | |
| 2003/0019221 A1 | 1/2003 | Rossi et al. | |
| 2003/0042004 A1 | 3/2003 | Novotny et al. | |
| 2003/0115000 A1 | 6/2003 | Bodas | |
| 2003/0115024 A1* | 6/2003 | Snevely | 703/1 |
| 2003/0121689 A1 | 7/2003 | Rasmussen et al. | |
| 2003/0147216 A1 | 8/2003 | Patel et al. | |
| 2003/0158718 A1 | 8/2003 | Nakagawa et al. | |
| 2003/0184975 A1 | 10/2003 | Steinman et al. | |
| 2003/0188208 A1 | 10/2003 | Fung | |
| 2003/0193777 A1 | 10/2003 | Friedrich et al. | |
| 2003/0196126 A1 | 10/2003 | Fung | |
| 2003/0200473 A1 | 10/2003 | Fung | |
| 2003/0204756 A1 | 10/2003 | Ransom et al. | |
| 2003/0236822 A1 | 12/2003 | Graupner et al. | |
| 2004/0020224 A1 | 2/2004 | Bash et al. | |
| 2004/0065097 A1 | 4/2004 | Bash et al. | |
| 2004/0065100 A1 | 4/2004 | Jacobsen | |
| 2004/0065104 A1 | 4/2004 | Bash et al. | |
| 2004/0073597 A1 | 4/2004 | Caveney et al. | |
| 2004/0075343 A1 | 4/2004 | Wareham et al. | |
| 2004/0075984 A1 | 4/2004 | Bash et al. | |
| 2004/0083012 A1 | 4/2004 | Miller | |
| 2004/0089009 A1 | 5/2004 | Bash et al. | |
| 2004/0089011 A1 | 5/2004 | Patel et al. | |
| 2004/0098991 A1 | 5/2004 | Heyes | |
| 2004/0099747 A1 | 5/2004 | Johnson et al. | |
| 2004/0100770 A1 | 5/2004 | Chu et al. | |
| 2004/0120855 A1 | 6/2004 | Reichel et al. | |
| 2004/0163001 A1 | 8/2004 | Bodas | |
| 2004/0190247 A1 | 9/2004 | Chu et al. | |
| 2004/0230848 A1 | 11/2004 | Mayo et al. | |
| 2004/0240514 A1 | 12/2004 | Bash et al. | |
| 2004/0262409 A1 | 12/2004 | Crippen et al. | |
| 2005/0016189 A1 | 1/2005 | Wacker | |
| 2005/0023363 A1 | 2/2005 | Sharma et al. | |
| 2005/0044882 A1 | 3/2005 | Hong et al. | |
| 2005/0055590 A1 | 3/2005 | Farkas et al. | |
| 2005/0061013 A1 | 3/2005 | Bond | |
| 2005/0108582 A1 | 5/2005 | Fung | |
| 2005/0132729 A1 | 6/2005 | Manole | |
| 2005/0170770 A1 | 8/2005 | Johnson et al. | |
| 2005/0177755 A1 | 8/2005 | Fung | |
| 2005/0213306 A1 | 9/2005 | Vos et al. | |
| 2005/0225936 A1 | 10/2005 | Day | |
| 2005/0228618 A1 | 10/2005 | Patel et al. | |
| 2005/0237715 A1 | 10/2005 | Staben et al. | |
| 2005/0237716 A1 | 10/2005 | Chu et al. | |
| 2005/0246431 A1 | 11/2005 | Spitaels | |
| 2005/0248922 A1 | 11/2005 | Chu et al. | |
| 2005/0251802 A1 | 11/2005 | Bozek et al. | |
| 2005/0267639 A1 | 12/2005 | Sharma et al. | |
| 2005/0284169 A1 | 12/2005 | Tamura et al. | |
| 2006/0002086 A1 | 1/2006 | Teneketges et al. | |
| 2006/0042289 A1 | 3/2006 | Campbell et al. | |
| 2006/0080001 A1 | 4/2006 | Bash et al. | |
| 2006/0081545 A1 | 4/2006 | Rassmussen et al. | |
| 2006/0096306 A1 | 5/2006 | Okaza et al. | |
| 2006/0102575 A1 | 5/2006 | Mattlin et al. | |
| 2006/0112286 A1 | 5/2006 | Whalley et al. | |
| 2006/0121421 A1 | 6/2006 | Spitaels et al. | |
| 2006/0126296 A1 | 6/2006 | Campbell et al. | |
| 2006/0139877 A1 | 6/2006 | Germagian et al. | |
| 2006/0144073 A1 | 7/2006 | Lee et al. | |
| 2006/0162357 A1 | 7/2006 | Fink et al. | |
| 2006/0168975 A1 | 8/2006 | Malone et al. | |
| 2006/0214014 A1 | 9/2006 | Bash et al. | |
| 2006/0232945 A1 | 10/2006 | Chu et al. | |
| 2006/0242288 A1 | 10/2006 | Masurkar | |
| 2006/0250770 A1 | 11/2006 | Campbell et al. | |
| 2006/0260338 A1 | 11/2006 | VanGilder et al. | |
| 2006/0276121 A1 | 12/2006 | Rasmussen | |
| 2007/0038414 A1* | 2/2007 | Rasmussen et al. | 703/1 |
| 2007/0072536 A1 | 3/2007 | Johnson et al. | |
| 2007/0074537 A1 | 4/2007 | Bean et al. | |
| 2007/0076373 A1 | 4/2007 | Fink | |
| 2007/0078635 A1 | 4/2007 | Rasmussen et al. | |
| 2007/0081302 A1 | 4/2007 | Nicolai et al. | |
| 2007/0088822 A1 | 4/2007 | Coile et al. | |
| 2007/0091569 A1 | 4/2007 | Campbell et al. | |
| 2007/0091570 A1 | 4/2007 | Campbell et al. | |
| 2007/0121295 A1 | 5/2007 | Campbell et al. | |
| 2007/0129000 A1 | 6/2007 | Rasmussen et al. | |
| 2007/0143767 A1* | 6/2007 | Attanasio et al. | 718/104 |
| 2007/0146994 A1 | 6/2007 | Germagian et al. | |
| 2007/0150215 A1 | 6/2007 | Spitaels et al. | |
| 2007/0163748 A1 | 7/2007 | Rasmussen et al. | |
| 2007/0165377 A1 | 7/2007 | Rasmussen et al. | |
| 2007/0167125 A1 | 7/2007 | Rasmussen et al. | |
| 2007/0171613 A1 | 7/2007 | McMahan et al. | |
| 2007/0174024 A1 | 7/2007 | Rasmussen et al. | |
| 2007/0187343 A1 | 8/2007 | Colucci et al. | |
| 2007/0190919 A1 | 8/2007 | Donovan et al. | |
| 2007/0213000 A1 | 9/2007 | Day | |
| 2007/0271475 A1 | 11/2007 | Hataski et al. | |
| 2007/0274035 A1 | 11/2007 | Fink et al. | |
| 2008/0002364 A1 | 1/2008 | Campbell et al. | |
| 2008/0004837 A1 | 1/2008 | Zwinger et al. | |
| 2008/0037217 A1 | 2/2008 | Murakami et al. | |
| 2008/0041076 A1 | 2/2008 | Tutunoglu et al. | |
| 2008/0055850 A1 | 3/2008 | Carlson et al. | |
| 2008/0055852 A1 | 3/2008 | Uluc et al. | |
| 2008/0104985 A1 | 5/2008 | Carlsen | |
| 2008/0105412 A1 | 5/2008 | Carlsen et al. | |
| 2008/0105753 A1 | 5/2008 | Carlsen et al. | |

(56) References Cited

U.S. PATENT DOCUMENTS

| | | | |
|---|---|---|---|
| 2008/0141703 | A1 | 6/2008 | Bean, Jr. |
| 2008/0142068 | A1 | 6/2008 | Bean et al. |
| 2008/0174954 | A1 | 7/2008 | VanGilder et al. |
| 2008/0177424 | A1 | 7/2008 | Wheeler |
| 2008/0198549 | A1 | 8/2008 | Rasmussen et al. |
| 2008/0229318 | A1 | 9/2008 | Franke |
| 2008/0245083 | A1 | 10/2008 | Tutunoglu et al. |
| 2009/0007591 | A1 | 1/2009 | Bean et al. |
| 2009/0030554 | A1 | 1/2009 | Bean, Jr. et al. |
| 2009/0121547 | A1 | 5/2009 | Paik et al. |
| 2009/0138313 | A1* | 5/2009 | Morgan et al. ............ 705/8 |
| 2009/0138888 | A1 | 5/2009 | Shah et al. |
| 2009/0150123 | A1* | 6/2009 | Archibald et al. ............ 703/1 |
| 2009/0168345 | A1 | 7/2009 | Martini |
| 2009/0205416 | A1 | 8/2009 | Campbell et al. |
| 2009/0223234 | A1 | 9/2009 | Campbell et al. |
| 2009/0259343 | A1 | 10/2009 | Rasmussen et al. |
| 2009/0309570 | A1* | 12/2009 | Lehmann et al. ............ 323/318 |
| 2009/0326879 | A1* | 12/2009 | Hamann et al. ............ 703/2 |
| 2009/0326884 | A1 | 12/2009 | Amemiya et al. |
| 2009/0327012 | A1* | 12/2009 | Sharma et al. ............ 705/8 |
| 2010/0057263 | A1 | 3/2010 | Tutunoglu |
| 2010/0106464 | A1 | 4/2010 | Hlasny et al. |
| 2010/0170663 | A1 | 7/2010 | Bean, Jr. |
| 2010/0211669 | A1 | 8/2010 | Dalgas et al. |
| 2010/0211810 | A1 | 8/2010 | Zacho |
| 2010/0256959 | A1 | 10/2010 | VanGilder et al. |
| 2010/0286956 | A1 | 11/2010 | VanGilder et al. |
| 2010/0287018 | A1* | 11/2010 | Shrivastava et al. ............ 705/8 |
| 2011/0040529 | A1* | 2/2011 | Hamann et al. ............ 703/1 |
| 2012/0221872 | A1 | 8/2012 | Artman et al. |
| 2013/0006426 | A1 | 1/2013 | Healey et al. |

FOREIGN PATENT DOCUMENTS

| | | | |
|---|---|---|---|
| EP | 0602911 | A1 | 6/1994 |
| EP | 1610077 | A2 | 12/2005 |
| EP | 1672300 | A1 | 6/2006 |
| FR | 2624684 | A1 | 6/1989 |
| FR | 2864854 | A1 | 7/2005 |
| JP | 63-127042 | A | 5/1988 |
| JP | 07269926 | A | 10/1995 |
| JP | 09-298377 | A | 11/1997 |
| JP | 2001-260640 | A | 9/2001 |
| JP | 2002-101973 | A | 4/2002 |
| JP | 2002-119339 | A | 4/2002 |
| WO | 03/083631 | A1 | 10/2003 |
| WO | 03081406 | A1 | 10/2003 |
| WO | 2005081091 | A2 | 9/2005 |
| WO | 2005122664 | A1 | 12/2005 |
| WO | 2006/034718 | A1 | 4/2006 |
| WO | 2006119248 | A2 | 11/2006 |
| WO | 20060124240 | A2 | 11/2006 |
| WO | 2007095144 | A2 | 8/2007 |
| WO | 2008144375 | A2 | 11/2008 |
| WO | 2009/014893 | A1 | 1/2009 |

OTHER PUBLICATIONS

"Essential Cooling System Requirements for Next Generation Data Centers," White Paper #5, Revision 3, 2003 American Power Conversion, Rev 2002-3, pp. 1-10.

"Management Strategy for Network Critical Physical Infrastructure", White Paper #100, pp. 110, American Power Conversion, Dec. 15, 2003, published on World Wide Web.

Abdlmonem H. Beitelmal et al.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.

Ahmad, Jasim U. et al., "Navier-Stokes simulation of air-conditioning facility of a large modern computer room," Jun. 2005, Proceedings of the 2005 ASME Fluids Engineering Division Summer Meeting and Exhibition, pp. 1-6.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Chandrakant D. Patel, et al., "Thermal Considerations in Cooling Large Scale High Copute Density Data Centers" IEEE 2002, pp. 767-776.

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Miminizing data center cooling and server power costs", Proceedings of the 14th ACM/IEEE International Symposium on Low Power Electronics and Design, ISLPED '09, Jan, 1, 2009, p. 145, XP55015368, New York, New York, USA, DOI: 10.1145/1594233.1594268, ISBN: 978-1-60-558684-7.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, D0I:10.1007/S10619-006-7007-3.

Jeonghwan Choi et al., "A CFD-Based Tool for Studying Temperature in Rack-Mounted Servers", IEEE Transactions on Computers, IEEE Service Center, Los Alamitos, CA, US, vol. 57, No. 8, Aug. 1, 2008, pp. 1129-1142, ISSN: 0018-9340, DOI: 10.1109/TC.2008.52.

K. Dunlap, "Cooling Audit for Identifying Potential Cooling Problems in Data Centers", White Paper #40, pp. 1-18, American Power Conversion, May 20, 2004, published on World Wide Web.

Karki et al., "Techniques for controlling airflow distribution in raised-floor data centers," ASME 2003.

Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, In Proceedings of the 2nd Bangalore Annual Compute Conference (Compute '09).

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Neil Rasmussen, "Air Distribution Architecture Options for Mission Critical Facilities," White Paper #55, Revision 1, 2003 American Power Conversion, Rev 2003-0, pp. 1-13.

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Guidelines for Specification of Data Center Power Density," White Paper #120, 2005 American Power Conversion, Rev 2005-0, pp. 1-21.

Pakbaznia, E.; Ghasemazar, M.; Pedram, M.:, "Temperature-aware dynamic resource provisioning in a power-optimized datacenter,"

(56) References Cited

OTHER PUBLICATIONS

Design, Automation & Test in Europe Conference & Exhibition (Date), 2010, vol., No., pp. 124-129, Mar. 8-12, 2010.
Refai-Ahmed G. et al., "Analysis of flow distribution in power supply using flow network modeling (FNM)", Thermal and Thermomechanical Phenomena in Electronic Systems, 2000, It Herm 2000, The Seventh Intersociety Conference on May 23-26, 2000, Piscataway, NJ, USA, IEEE, Piscataway, NJ, USA, vol. 1, May 23, 2000, pp. 90-98, ISBN: 978-0-7803-5912-3.
Sharma, R.K, Bash, C.E, and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.
Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.
Shrivastava S.K. et al., "A flow-network model for predicting rack cooling in containment systems", Proceedings of the ASME Interpack Conference—2009: Presented At 2009 ASME Interpack Conference, Jul. 19-23, 2009, San Francisco, California, USA, vol. 2, Jul. 19, 2009, pp. 785-791.
Toulouse M.M. et al., "Exploration of a potential-flow-based compact model of air-flow transport in data centers", Proceedings of the ASME International Mechanical Engineering Congress and Exposition—2009: Presented At 2009 ASME International Mechanical Engineering Congress and Exposition, Nov. 13-19, 2009, Lake Buena Vista, Florida, USA, vol. 13: New Del, vol. 13, Jan. 1, 2009, pp. 41-50, DOI: 10.1115/IMECE2009-10806, ISBN: 978-0-7918-4386-4.
Vangilder et al., "Airflow Uniformity thourhg Perforated Tiles in a Raised-Floor Data Center", White Paper 121, Jul. 17-22, 2005, 10 pages.
Vangilder, James W. et al., "Caputure index: an airflow-based rack cooling performance metric," 2007, ASHRAE Transactions, vol. 113, pp. 126-136.
Vangilder, James W. et al., "Real-Time prediction of rack-cooling performance," 2006, ASHRAE Transactions, vol. 112, pp. 151-162.
Vangilder, James, W., et al., "Capture index: an airflow-based rack cooling performance metric," 2007, ASHRAE Transactions, vol. 113, pp. 126-136.
Vangilder, James, W., et al., "Real-time prediction of rack-cooling performance," 2006, ASHRAE Transactions, vol. 112, pp. 151-162.
Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.
Le et al., "Operating Behaviour of Single Split Coil Systems Under Modulating and Two-Position Control", Published 2005 by American Society of Heating, Refrigerating and Air-Conditioning Engineers, Inc.
Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.
Vanessa Lopez et al., "Measurement-based modeling for data centers", Thermal and Thermomechanical Phenomena in Electronic Systems (ITHERM), 2010 12th IEEE Intersociety Conference on, IEEE, Piscataway, NJ, USA, Jun. 2, 2010, pp. 1-8, XP031702357.

\* cited by examiner

SYSTEM AND METHOD FOR SEQUENTIAL PLACEMENT OF COOLING RESOURCES WITHIN DATA CENTER LAYOUTS

BACKGROUND

1. Field of the Invention

At least one embodiment in accordance with the present invention relates generally to systems and methods for data center management and design, and more specifically, to systems and methods for managing data center airflow and energy usage and for arranging equipment in a data center based on airflow and energy usage.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these racks are organized into rows and clusters having hot and cold aisles to decrease the cost associated with cooling the information technology equipment. These characteristics make data centers a cost effective way to deliver the computing power required by many software applications.

Various processes and software applications, such as the InfraStruxure® family of products available from American Power Conversion by Schneider Electric (APC) of West Kingston, R.I., have been developed to aid data center personnel in designing and maintaining efficient and effective data center configurations. These tools often guide data center personnel through activities such as designing the data center structure, positioning equipment within the data center prior to installation and adding, repositioning, or removing equipment after construction and installation are complete. Thus, conventional tool sets provide data center personnel with a standardized and predictable design methodology.

SUMMARY OF THE INVENTION

According to aspects of an embodiment, a computer-implemented method for sequential placement of cooling resources in a data center, comprises: defining a weighted, higher-order cooling metric, $\hat{M}$, representing an overall performance of the cooling resources in the data center; enumerating all possible locations in the data center for placing an additional c cooling resources; and placing the c cooling resources in locations in the data center for which $\hat{M}$ is closest to an optimum value. In one variation, the computer-implemented method can further comprise: defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the data center, C represents a total number of cooling resources placed in the data center, i represents one of the R racks in the data center, $M_i^{(k)}$ represents a value of metric $M_i$ when k cooling resources are shut down, and a(i,k) is a weighting function for rack i with the k cooling resources shut down. In another variation, the computer-implemented method can further comprise: repeating enumerating and placing until a desired stopping condition is met by a resulting placement of cooling resources. In a further variation, the stopping condition is a desired redundancy level. In another further variation, the computer-implemented method further comprises: testing whether the desired stopping condition is met by a new resulting placement of cooling resources after removing one cooling resource from the resulting placement of cooling resources. In yet another further variation, the computer-implemented method further comprises: identifying that cooling resource which when removed results in a value of $\hat{M}$ closest to an optimum value; and removing that cooling resource identified. In yet another variation, $M_i$ is capture index.

In accordance with aspects of another embodiment, a system for sequential placement of cooling resources in a data center layout, comprises: a computer storage system in which is stored a database holding a numerical computer model of the data center layout; and a computer processor executing a sequence of instructions directing: defining a weighted, higher-order cooling metric, $\hat{M}$, representing an overall performance of the cooling resources in the data center; enumerating all possible locations in the data center for placing an additional c cooling resources; and placing the c cooling resources in locations in the data center for which $\hat{M}$ is closest to an optimum value. In a variation, defining further comprises: defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the data center, C represents a total number of cooling resources placed in the data center, i represents one of the R racks in the data center, $M_i^{(k)}$ represents a value of metric $M_i$ when k cooling resources are shut down, and a(i,k) is a weighting function for rack i with the k cooling resources shut down. In another variation, the sequence of instructions further comprises: repeating enumerating and placing until a desired stopping condition is met by a resulting placement of cooling resources. In yet another variation, the stopping condition is a desired redundancy level. In an additional variation, the sequence of instructions further comprises: testing whether the desired stopping condition is met by a new resulting placement of cooling resources after removing one cooling resource from the resulting placement of cooling resources. In a further variation, the sequence of instructions further comprises: identifying that cooling resource which when removed results in a value of $\hat{M}$ closest to an optimum value; and removing that cooling resource identified.

In accordance with aspects of yet another embodiment, a computer-readable medium has stored thereon sequences of instructions including instructions that will cause a processor to: define a weighted, higher-order cooling metric, $\hat{M}$, representing an overall performance of the cooling resources in the data center; enumerate all possible locations in the data center for placing an additional c cooling resources; and place the c cooling resources in locations in the data center for which $\hat{M}$ is closest to an optimum value. In a variation, defining further comprises: defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the data center, C represents a total number of cooling resources placed in the data center, i represents one of the R racks in the data center, $M_i^{(k)}$ represents a value of metric $M_i$ when k cooling resources are shut down, and a(i,k) is a weighting function for rack i with the k cooling resources shut down. In another variation, the sequences of instructions further causing the processor to: repeat enumerating and placing until a desired stopping condition is met by a resulting placement of cooling resources. In yet another variation, the stopping condition is a desired redundancy level. In an additional variation, the sequences of instructions further cause the processor to: test whether the desired stopping condition is met by a new resulting placement of cooling resources after removing one cooling resource from the resulting placement of cooling resources. In another additional variation, the sequences of instructions further cause the processor to: identify that cooling resource which when removed results in a value of $\hat{M}$ closest to an optimum value; and remove that cooling resource identified. In a further variation, $M_i$ is a capture index metric.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
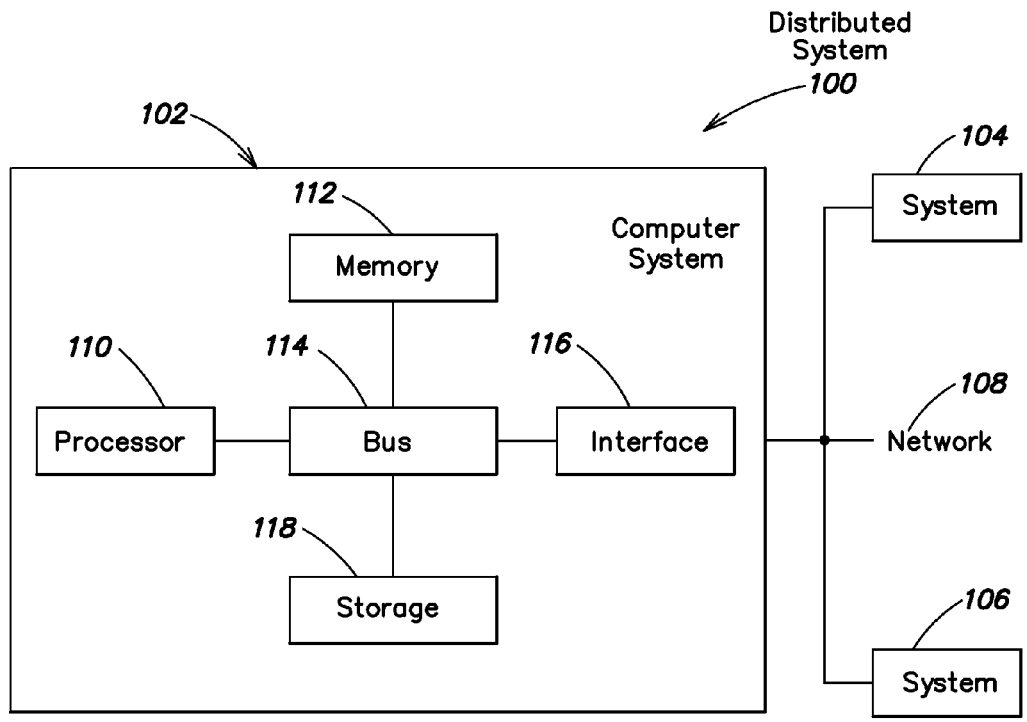
FIG. 1 shows an example computer system with which various aspects in accord with the present invention may be implemented.

At least some embodiments in accordance with the present invention relate to systems and processes through which a user may design data center configurations. These systems may facilitate this design activity by allowing the user to create models of data center configurations from which performance metrics may be determined. Both the systems and the user may employ these performance metrics to determine alternative data center configurations that meet various design objectives. Further, in at least one embodiment, a system will provide an initial layout of data center equipment and conduct a cooling analysis on the layout in real time.

The aspects disclosed herein in accordance with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments of the data center may be used to automatically measure environmental parameters in a data center, and control equipment, such as chillers or coolers to optimize performance. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Designing Data Center Cooling

As described in U.S. patent application Ser. No. 12/019,109, titled "System and Method for Evaluating Equipment Rack Cooling", filed Jan. 24, 2008, and in U.S. patent application Ser. No. 11/342,300, titled "Methods and Systems for Managing Facility Power and Cooling" filed Jan. 27, 2006 both of which are assigned to the assignee of the present application, and both of which are hereby incorporated herein by reference in their entirety, typical equipment racks in modern data centers draw cooling air in the front of the rack and exhaust air out the rear of the rack. The equipment racks and in-row coolers are typically arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool or cold aisle cluster, and adjacent rows of equipment racks separated by a hot aisle may be referred to as a hot aisle cluster. As readily apparent to one of ordinary skill in the art, a row of equipment racks may be part of one hot aisle cluster and one cool aisle cluster. In descriptions and claims herein, equipment in racks, or the racks themselves, may be referred to as cooling consumers, and in-row cooling units and/or computer room air conditioners (CRACs) may be referred to as cooling providers. In the referenced patent applications, tools are provided for analyzing the cooling performance of a cluster of racks in a data center. In these tools, multiple analyses may be performed on different layouts to attempt to optimize the cooling performance of the data center.

In embodiments of the invention, different cooling performance metrics may be used to evaluate the cooling performance of a cluster. These metrics include capture index (CI) and recirculation index (RI) both of which are described in further detail in the applications, incorporated by reference above. In general, for a hot aisle cluster, the capture index indicates for each rack the percentage of the rack exhaust air that is captured by all of the coolers in the cluster. For a cool aisle cluster, the capture index indicates for each rack the percentage of rack airflow that is supplied directly by local cooling providers.

In at least one embodiment, a model of a data center is generated and displayed and a cooling analysis is provided of the data center. In creating a model, in at least one embodiment, a user may define a set of equipment racks and cooling providers to be included in a cluster, and the system will automatically arrange the equipment racks and the cooling providers in the cluster in a manner that will satisfy cooling requirements of the equipment racks.

A method according to aspects of at least one embodiment automatically identifies and places a number of in-row or over-aisle cooling units to adequately cool a given layout of data center objects. The method sequentially adds cooling units to the layout, until the cooling provided to a subject rack meets a user-defined criterion, usually a prescribed capture index (CI) or temperature. According to aspects of an embodiment, coolers are placed sequentially; the best location for each cooler is determined by an evaluation of cooling performance resulting from placing the cooler at each possible position within the layout.

Efficient placement of cooling resources within a data center is a difficult problem, due to the complex airflow patterns that must be evaluated and the enormous number of possible layouts that must be considered. When designing and building mission-critical facilities, such as data centers, designers commonly err on the side of an over-abundance of cooling, wasting cooling resources including considerable power consumption by the data center. To limit the waste of resources, methods embodying aspects of the invention automate the design of layouts that have good cooling coverage and yet do not waste cooling resources.

Methods embodying aspects of the invention flexibly handle new cooling technologies and guarantee user-specified requirements for one or more of maximum inlet temperature, minimum capture index, or minimum cooling redundancy. By utilizing a generic airflow prediction engine, such as computational fluid dynamics (CFD), potential flow, algebraic calculators, or neural networks, to make estimates, many situations are accurately modeled. The guarantee that a layout meet certain user-specified requirements is achieved because the sequential placement of in-row and over-aisle cooling units permits checking of the user-specified requirements after each cooling unit, or set of cooling units, is allocated to the layout. Checking of the user-specified requirements against design performance thus need not wait for a completed design.

Aspects of embodiments include computer-implemented methods, computer systems programmed to perform such methods, and computer media carrying instructions for a processor to carry out such methods. Computer systems suitable for practicing such aspects of embodiments are now described.

Computer System

General Description

Various aspects and functions described herein in accord with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accord with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accord with the present invention may be implemented within methods, acts, systems, system elements and components using a variety of hardware and software configurations; the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accord with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Intel Core, Intel Xeon, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile storage device. Various embodiments in accord with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI, Infini-Band, and others. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accord with the present invention may be practiced, aspects of the invention are not limited to being implemented on the computer system as shown in FIG. 1. Various aspects and functions in accord with the present invention may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X on Motorola PowerPC processors, Intel Core processors, or Intel Xeon processors, and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., and Debian-derived GNU/Linux distributions such as Ubuntu, a Solaris operating system available from Sun Microsystems, or a UNIX operating systems available from various sources. Many other operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accord with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used.

A computer system included within an embodiment may perform functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
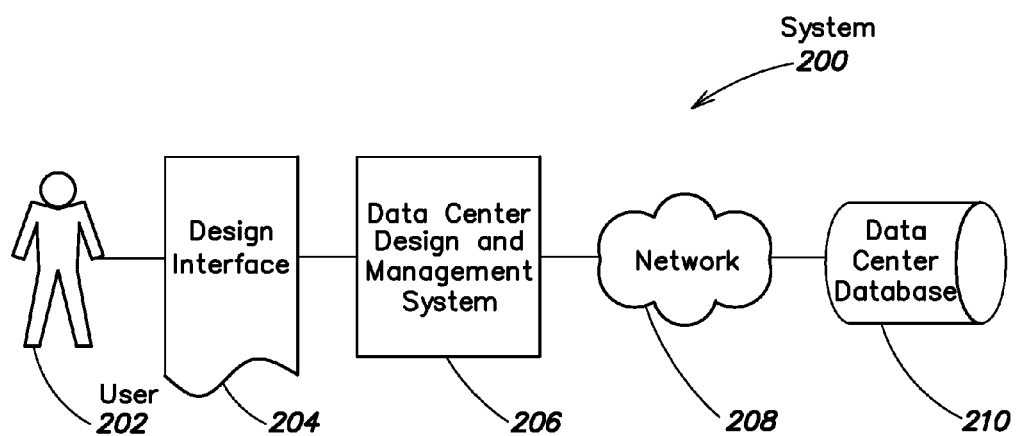
FIG. 2 illustrates an example distributed system including an embodiment.

FIG. 2 presents a context diagram including physical and logical elements of distributed system 200. As shown, distributed system 200 is specially configured in accord of the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 which interacts with user 202, includes design interface 204, data center design and management system 206, communications network 208 and data center database 210. System 200 may allow user 202, such as a data center architect or other data center personnel, to interact with design interface 204 to create or modify a model of one or more data center configurations. According to one embodiment, design interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, design interface 204 may be implemented with specialized facilities that enable user 202 to design, in a drag and drop fashion, a model that includes a representation of the physical layout of a data center or any subset thereof. This layout may include representations of data center structural components as well as data center equipment. The features of design interface 204, as may be found in various embodiments in accord with the present invention, are discussed further below.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support design interface 204, such as, among other data, the physical layout of one or more data center model configurations, the production and distribution characteristics of the cooling providers included in the model configurations, the consumption characteristics of the cooling consumers in the model configurations and one or more cooling metrics characterizing the amount of cool air produced by the cooling providers that is lost prior to being consumed by the cooling consumers.

In at least one embodiment, data center database 210 may store, as part of the physical layout of a data center model configuration, the location and characteristics of the tiles that make up surfaces of the data center, such as the floor, ceiling and walls, of a model space. In at least one embodiment, the tiles may be floor tiles that are part of a raised floor, while in another embodiment the tiles may be ceiling tiles that are part of a drop ceiling. The characteristics of the tiles stored in data center database 210 may include, among other characteristics, whether or not the tiles are perforated, the size of the tiles and cooling metrics associated with the tiles, such as, in the example of a perforated tile, the airflow rate and temperature of air passing through it. As used herein, the term "perforated tile" may include any surface designed to allow airflow to pass through its boundary. Examples of perforated tiles include, among others standard-sized perforated tiles, custom-sized perforated tiles, cover grills and open holes. In some embodiments, this information is useful for providing enhanced functionality through design interface 204.

In another embodiment, data center database 210 may store, as a portion of the production and distribution characteristics of the cooling providers, the type of cooling provider, the amount of cool air provided by the cooling provider, and a temperature of cool air provided by the cooling provider. Thus, for example, data center database 210 includes record of a particular type of CRAC unit that is rated to deliver airflow at the rate of 5,600 cfm at a temperature of 68 degrees Fahrenheit. In addition, the data center database 210 may store one or more cooling metrics, such as an airflow leakage rate of an air plenum, such as a raised floor or a drop ceiling.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, the invention is not limited to a specific number of users or systems.

Design Interface Embodiments

According to various embodiments, design interface 204 may provide users with a high degree of flexibility regarding how and when they design data center cooling systems. In these embodiments, the user may design the entire cooling system in advance of the remainder of the data center configuration, may design the cooling system concurrently with other attributes of the data center or may design the cooling system after other parts of the data center design are complete. Thus, design interface 204 may be used to design new data centers or may be used to modify the designs of existing data centers. The formulation of useful systems and methods for conducting these design activities is impacted by the unique manner in which design interface 204 may be structured and organized. Conversely, the elements used and acts performed in these design activities impact the attributes and facilities of this embodiment of design interface 204.

Design interface 204 may provide functionality through a variety of user interface screens and elements. The user interface can include many of the user interface elements discussed in PCT/US08/63675 with regard to the floor editor and the rack editor. These elements may function within this embodiment as they function with the floor editor and the rack editor disclosed within PCT/US08/63675.

In the context of this design interface, an embodiment provides features for computing and ensuring cooling redundancy at specific rack locations. Conventionally, there is no concept of cooling redundancy at a specific rack location. A single redundancy level is conventionally stated for an entire facility. In some cases, some racks in a facility will have sufficient redundancy while others will not. Other facilities may be so over-designed to ensure cooling redundancy at all locations that substantial capital and ongoing energy costs are wasted. The exemplary embodiment provides a method by which redundancy can be computed for each rack location in a new or existing facility. With this information, data center designers and operators can make fact-based business decisions related to IT uptime and expenditures. For example, the designer of a new facility can minimize the number of coolers to just satisfy the level of redundancy required—which may be potentially different in different areas of the data center—thereby avoiding costs associated with over-provisioning. As another example, a data center operator may use the method to determine where to install a new server so that the cooling redundancy requirements of the new server will be met and that the cooling redundancy of other nearby IT equipment will not be adversely affected by the installation.

General Design Principles

A cooling metric that measures the overall cooling performance of the layout is defined to achieve a successful sequential, automatic placement method. Since a simple enumeration step is performed when searching for a place to allocate each cooling unit, an objective metric permits comparison of the cooling coverage provided by different prospective layouts that may be indistinguishable at first glance, especially when a high level of redundant cooling is required of a design. A new higher-order metric is introduced in the discussion that follows, that incorporates a common measure, such as temperature or capture index as a base, but also incorporates additional information about performance if one or more coolers fail.

The combination of sequential allocation of cooling resources with a new cooling metric to determine performance provides a robust, efficient method for placement of coolers within data center design and management tools. This method also allows for many different combinations of airflow prediction engines and higher-order metrics, which permits its use in other, more general, data center tools.

High-Level View

In this section, the following aspects of the novel auto-placement method are discussed:

1. Initial conditions—What setup and structure is used?
2. Stopping conditions—How the method will finish?
3. Choice of stage size—How many coolers are placed at a time?
4. Enumeration of locations—Where will coolers be placed?
5. Higher-order metrics—How can alternative placements be accurately compared?

Initial Conditions

According to aspects of some embodiments, two conditions should be observed.

First, objects should be placed using a row-based architecture, featuring hot and cold aisles. This condition is not very restrictive, as many layouts are organized in this manner. Restricting cooler placements to rows limits the number variables to consider, without significantly constraining performance that can be achieved in a given space. It is much simpler to place a cooler "between rack 1 and rack 2" than to optimize over all possible two-dimensional locations for the cooler. This condition is not strictly limited to rows. Aspects of embodiments can also operate on other well-behaved, non-standard geometries, such as curved and perpendicular arrangements having adjacent rack and aisle spaces.

Second, all non-cooling objects should be positioned within rows before placement of cooling units begins. Aspects of embodiments of the method place cooling units, rather than racks, Uninterruptible Power Supplies (UPSs), or Power Distribution Units (PDUs). The placement of cooling units can more easily be done if all other objects are already present, so the effectiveness of each cooling unit relative to the other objects can be verified. Otherwise, a more complex method including computations after the placement of each non-cooling object would be used, to ensure that the user-specified requirements have been met.

Stopping Conditions

Methods according to aspects of embodiments terminate upon meeting a stopping condition; that is, a check that a desired level of cooling performance has been met by the layout produced. Performance can be measured using any one of, or combination of, many different metrics, e.g., capture index, temperature, and redundancy. Efficient embodiments favor metrics having less computational overhead over metrics having more computational overhead. Such metrics include those disclosed in U.S. patent application Ser. No. 12/974,719, filed Dec. 21, 2010, U.S. patent application Ser. No. 12/416,567, filed Apr. 1, 2009, and U.S. patent application Ser. No. 11/342,300, filed Jan. 27, 2006, all incorporated herein by reference.

Stage Size, c

Aspects of some embodiments are flexible regarding the number of cooling units that will be placed in each stage of testing. Often, it might be useful to assign two or more coolers at a time to a layout, such as a hot aisle containment layout where row lengths remain equal. Containment layouts are those in which features of the space "contain" airflows by means of physical barriers or baffles. In such a layout, an aisle may be fully bounded by a floor, ceiling, racks, and containment barriers on all six sides.

Thus, put in general terms, the sequential process allocates c coolers at a time. While a large c may provide more accurate estimates of the number of necessary cooling units, enumerating all of the possible arrangements for c coolers can be extremely expensive. A tradeoff is therefore be made in the selection of the stage size, c, as illustrated in Table 1. Table 1 shows that large stage sizes use the most computational effort, but can be advantageous. For most applications, a stage size of one or two will be advisable.

TABLE 1

| c | Applications | Pros | Cons |
|---|---|---|---|
| 1 | Most layouts | Fast | Less accurate |
| 2 | Containment | Even row lengths | Slow |
| 3 | Non-containment layouts | Accuracy | Very Slow |
| 4 | Containment layouts | Accuracy; even row lengths | Very Slow |
| 5+ | Unusual designs | — | Too many layouts to test |

Users wishing to use large stage sizes may have to perform some additional computations to ensure that optimal results are reached. Granularity of the results achieved when using large stage sizes may be non-optimal, and so some adjustment steps may additionally be performed by the method. For example, if a layout requires 13 coolers, and a selected stage size of four places coolers with a granularity which is a multiple of four for the final number of coolers placed, the method would stop after placing 16 cooling units, rather than after placing the optimum number of 13 cooling units. Two possible aspects of embodiments which make the desired adjustment include: attempting to remove cooling units via "backtracking," as discussed below; or, back up one stage, so that 12 coolers have been placed, and then place coolers using a smaller stage size, e.g., 1, 2, or 3, until the number of coolers which satisfy the cooling requirements of the layout cannot be reduced.

Enumeration and Comparison of Possible Locations

Each step of the sequential method involves an enumeration of the possible locations to place c cooling units. Because the layout is constrained by an initial condition given above to be based on rows and aisles, there exist only a limited number of locations to place each cooler. The available spaces in which each cooling unit can be located will fall either before the first object of each row or after any object of a row.

The number of locations does not increase as coolers are placed, since typically the same unit will be used throughout the layout. Swapping the order of cooling units produces no airflow difference, and so for in-row units the number of locations available for remaining coolers remains constant. For over-aisle units, the placement of a cooler reduces the number of locations available for remaining coolers.

For each enumerated location, estimates of the performance measures of interest, e.g., CI, temperature, and redundancy, for the entire room are used. After computing such estimates the coolers are placed in the layout at locations that perform the best: maximizing overall CI, maximizing overall redundancy, and/or minimizing overall inlet temperatures. This objective comparison is not simple, so a new type of metric, discussed below, has been proposed which accommodates the details necessary for comparison of layouts.

The testing of locations is, at heart, an enumeration scheme. All possible placements for a cooling unit are tested, and the location that produces the most benefit for the room is selected as the result. However, enumeration does not necessarily make the method inefficient. The act of choosing an optimal location for one cooler at a time reduces the number of tested layouts significantly. Consider a layout with 40 racks that requires 10 in-row cooling units. Enumerating every possible location for the 10 coolers would require approximately $10^{10}$ layout calculations, but allocating only one cooler at time limits our calculations to only $10 \cdot 40 = 400$ layouts, an amount that real-time calculators can compute in only a second or two. Since only a small fraction of the possible layouts is tested, a 100% optimized design is not assured, but instead a fast, good, even near-optimized design is assured.

A New Metric for Optimizing Layouts

To effectively compare data center layouts, metrics indicative of how well a room is covered by cooling resources are required. During optimization, for example during a comparison of layouts, these metrics will be used to distinguish between the performance of different layouts and thus permit the method to return the best configuration, that is, the layout that provides the minimum or maximum value of the chosen metrics. While the cooling index metrics of inlet temperature, capture index, escaped power, and redundancy are often used to evaluate cooling performance at a rack level, these measures are not easily adapted to room or cluster optimization.

Figure 3:
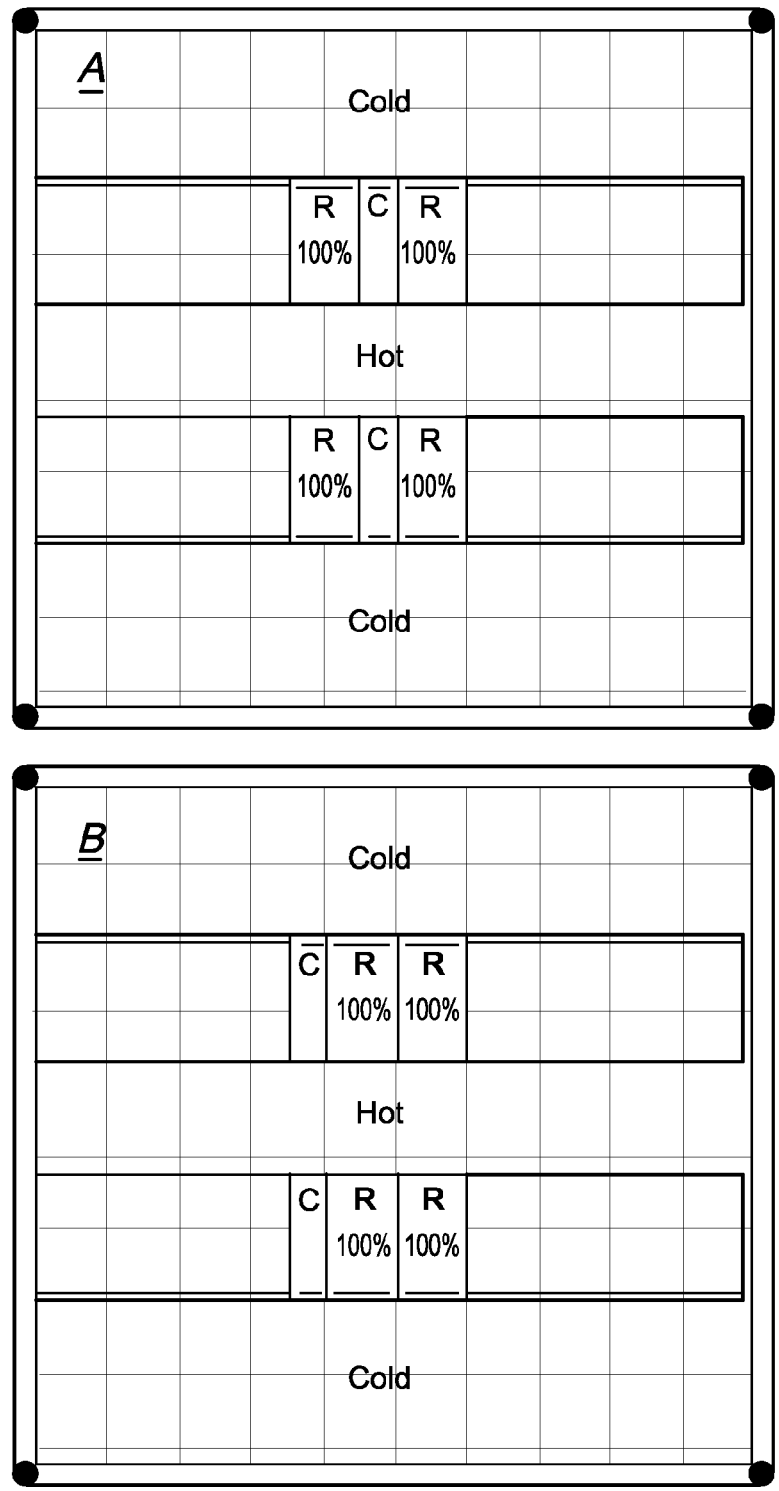
FIG. 3 is a side-by-side comparison of two similar floor plans distinguishable using a new metric of cooling performance.

FIG. 3 illustrates the limitations of these metrics with two distinct layouts as they might be shown in a current release of ISX Designer by APC. Using any of the metrics capture index, escaped power, and inlet temperature, both layouts appear to be identical; neither layout is better optimized than the other based on those three metrics. Layouts A and B each feature four racks R with 100% hot aisle and cold aisle capture indices, as marked on each rack in FIG. 3, meaning that all of the racks' hot air is captured by the cooling units and the rack inlet only takes in cold air supplied by the cooling units. These identical capture indices also indicate identical rack inlet temperatures when the cooling units operate at identical supply temperatures. But, from an energy efficiency and redundancy standpoint, layout A is intuitively preferred over layout B because it features shorter cooler-to-rack separation distances. Accordingly, a new set of "higher-order" cooling metrics is therefore defined that take into account measures of energy efficiency and redundancy. These new metrics also can be aggregated to obtain full-room estimates of cooling coverage, rather than simply a measure of the spot coverage at a particular rack which conventional metrics provide. These higher-order metrics provide:

1. Estimates of room cooling that can take on values from the set of real numbers, rather than a smaller set of numbers such as the whole numbers or integers, thus limiting the number of layouts that can share the same score. Layouts that produce results that are tightly grouped can nevertheless be easily distinguished.

2. Estimates that grade performance on multiple redundancy levels. This will allow comparison of layouts that would otherwise be indistinguishable at first glance, which commonly occurs in layouts with a large amount of cooling redundancy.

3. Flexibility to encourage even coverage of information technology (IT) loads or to reward extra coverage of critical IT load locations via the application of weighting schemes.

Let $M_i$ be a performance metric for rack i in a data center under design. This metric $M_i$ could be any of the common metrics utilized in data center design, such as inlet temperature, capture index, and escaped power (or any combination of these metrics). A new, higher-order metric M is defined as follows:

$M_i^{(k)} = M_i$, under the condition that the k coolers having the largest impact on $M_i$ have been turned off, failed, or otherwise been omitted from the measurement.

Methods of computing $M_i^{(k)}$, where $M_i$ is capture index (CI), cooling reliability index (CRI), or the like, are disclosed in U.S. patent application Ser. Nos. 12/974,719, 12/416,567, and 11/342,300, mentioned above.

To obtain an objective representation of an entire room of R racks cooled by C coolers, a weighted sum, $\hat{M}$, is computed of the higher-order metric $M_i^{(k)}$ over every value of k from 0 to C−1 and every value of i from 1 to R to obtain a weighted total measure. For example, if capture index is the metric $M_i$ of interest, the weighted higher-order metric of weighted total capture index is defined as:

$$\hat{M} = \sum_{k=0}^{C-1} \sum_{i=1}^{R} a(i,k) M_i^{(k)};$$

where a(i,k) is a weighting function for different racks, i, and redundancy levels, k, and $CI_i^{(k)}$ is the higher-order metric when CI is the performance measure of interest. Another higher-order metric could instead be used, for example total escaped power or total inlet temperature, resulting in weighted metrics of the weighted total escaped power or weighted total inlet temperature.

The weighting function a(i,k) allows for various redundancy levels and racks to be valued differently. One useful implementation is to weight each rack equally and give each successive redundancy level half the weight of the previous level. The resulting weighting function is:

$$a(i, k) = a(k) = \frac{1}{2^k};$$

and, the resulting weighted total capture index is:

$$\hat{M} = \sum_{k=0}^{C-1} \sum_{i=1}^{R} \frac{CI_i^{(k)}}{2^k}.$$

Using this higher-order metric based on capture index produces a distribution which tends to result in even coverage over all racks and typically ensures that all racks will be covered with a desired level of cooling before beginning to add cooling redundancies into the layout. Some users may require uneven cooling coverage to address particular needs. In those cases, simple weighting schemes can be devised, for example to ensure that mission-critical racks are covered with a higher level of redundancy, without much adjustment to the metric. For example constant multipliers can be applied to certain racks and not to others.

Sequential Placement Methods

The various concepts and aspects of embodiments described above are integrated and combined into sequential placement methods, including two described now.

A Basic Method

Figure 4:
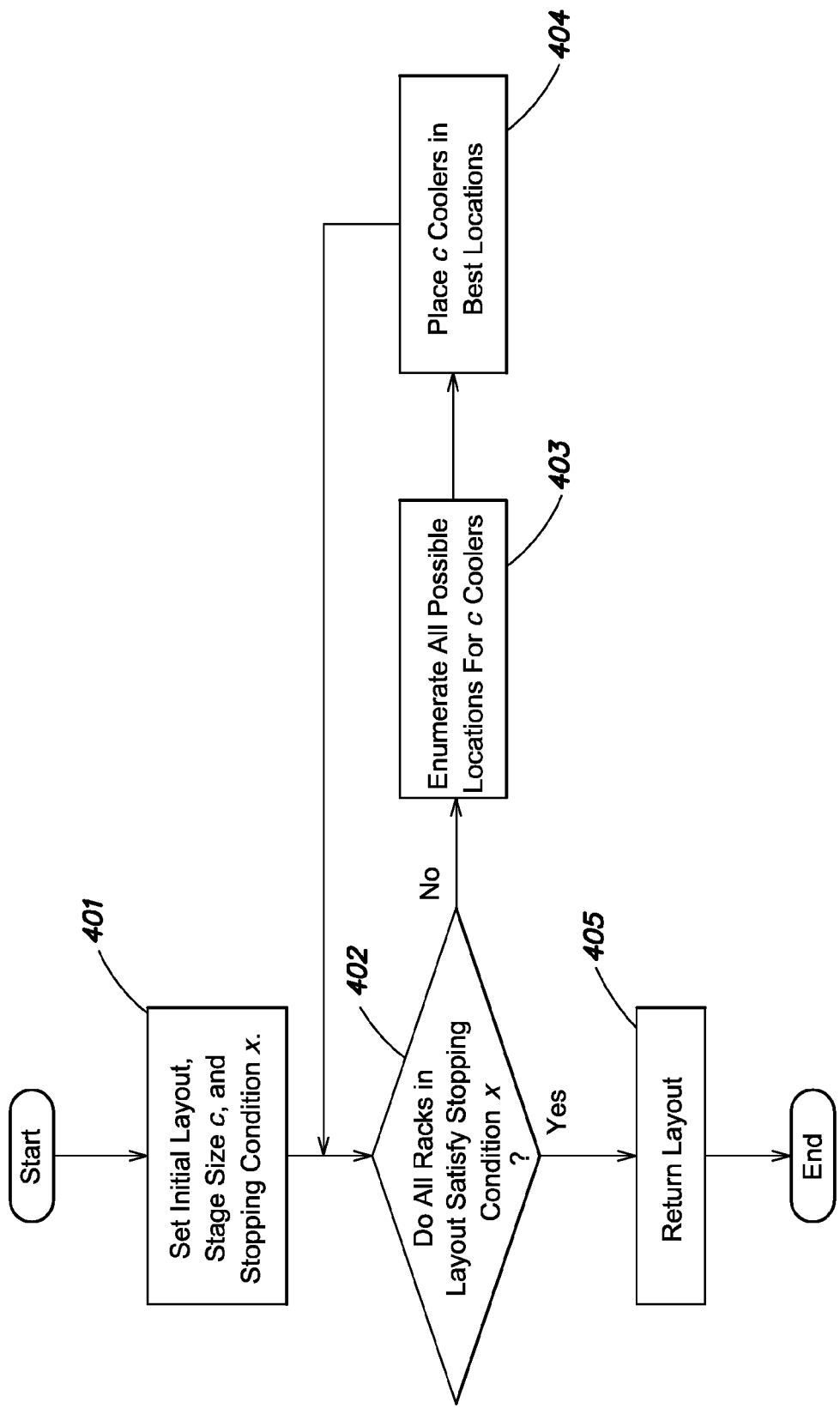
FIG. 4 is a flowchart defining a sequential placement method according to aspects of an embodiment.

An exemplary, basic method, performed by software executing on a computer processor operates as follows. The method is illustrated in the flowchart of FIG. 4. First, a user selects an initial layout, stage size, c, and stopping conditions, x, step 401. The method then enters a loop where the stopping condition is checked, step 402, and if not met, steps for placing coolers are then performed. Those steps include enumerating all possible locations for the stage of c coolers, step 403; followed by placing the c coolers in the best locations found as determined by evaluating a cooling metric for each of the enumerated layouts, step 404. Within step 404, one of the higher-order metrics discussed above is evaluated and applied in determining the best locations for a stage of c coolers. Any suitable higher-order metric and/or weighting function as explained above can be used. Control then returns to the test for the stopping condition, step 402.

Once the stopping condition is met, step 402, the layout that has been sequentially developed is returned, step 405.

A Modified Method Including Backtracking

The basic method can produce sub-optimal results in some cases. This arises because sequential placement of individual coolers may not provide the same results as if all of the coolers were placed at once. Therefore, an enhancement of the basic method includes backtracking, which systematically checks the end result and removes unnecessary coolers, as shown in FIG. 5.

Figure 5:
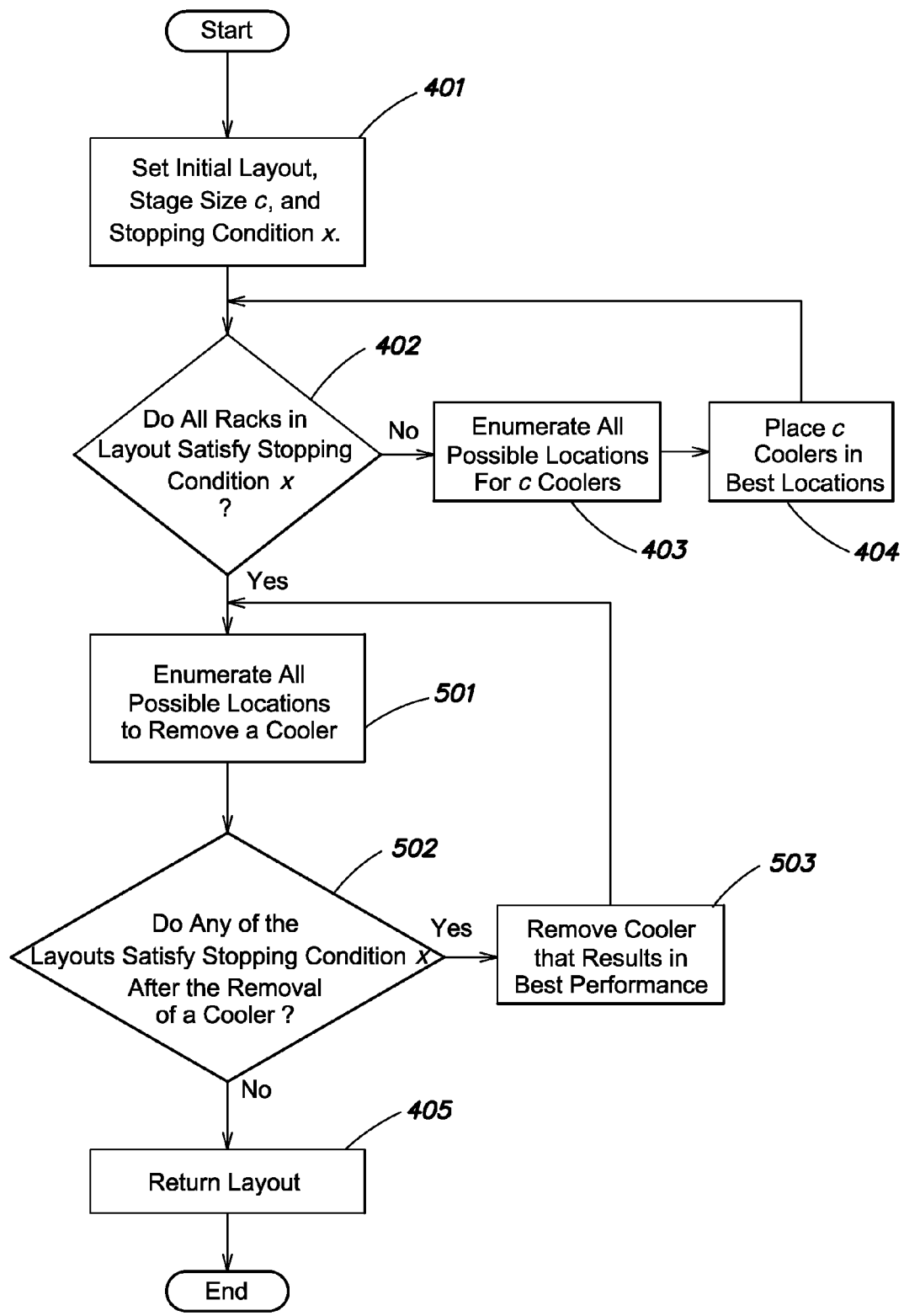
FIG. 5 is a flowchart defining a sequential placement method including backtracking according to aspects of another embodiment.

The initial placement proceeds as described above in connection with FIG. 4, thus like reference numerals are used in this description of FIG. 5. First, a user selects an initial layout, stage size, c, and stopping conditions, x, step 401. The method then enters a loop where the stopping condition is checked, step 402, and if not met, steps for placing coolers are then performed. Those steps include enumerating all possible locations for the stage of c coolers, step 403; followed by placing the c coolers in the best locations found as determined by evaluating a cooling metric for each of the enumerated layouts, step 404. Within step 404, one of the higher-order metrics discussed above is evaluated and applied in determining the best locations for a stage of c coolers. Any suitable higher-order metric and/or weighting function as explained above can be used. Control then returns to the test for the stopping condition, step 402.

Once the stopping condition is met, step 402, a backtracking loop commences at step 501 by enumerating all possible locations from which a cooler can now be removed. Next, a test is performed to determine whether the layout satisfies the stopping condition x with one cooler less than presently in the layout, step 502. If the test is satisfied, step 502, the cooler determined in the enumeration of step 501 to be the best location from which to remove a cooler is, in fact, removed, step 503. Control then returns to the enumeration at step 501, which is performed over the new layout having one cooler fewer than the previous pass through the backtracking loop, steps 501, 502, and 503.

After the backtracking loop completes, which occurs when the test at step 501 first fails, the layout that has been sequentially developed and then backtracked is returned, step 405.

An Example

Figure 6:
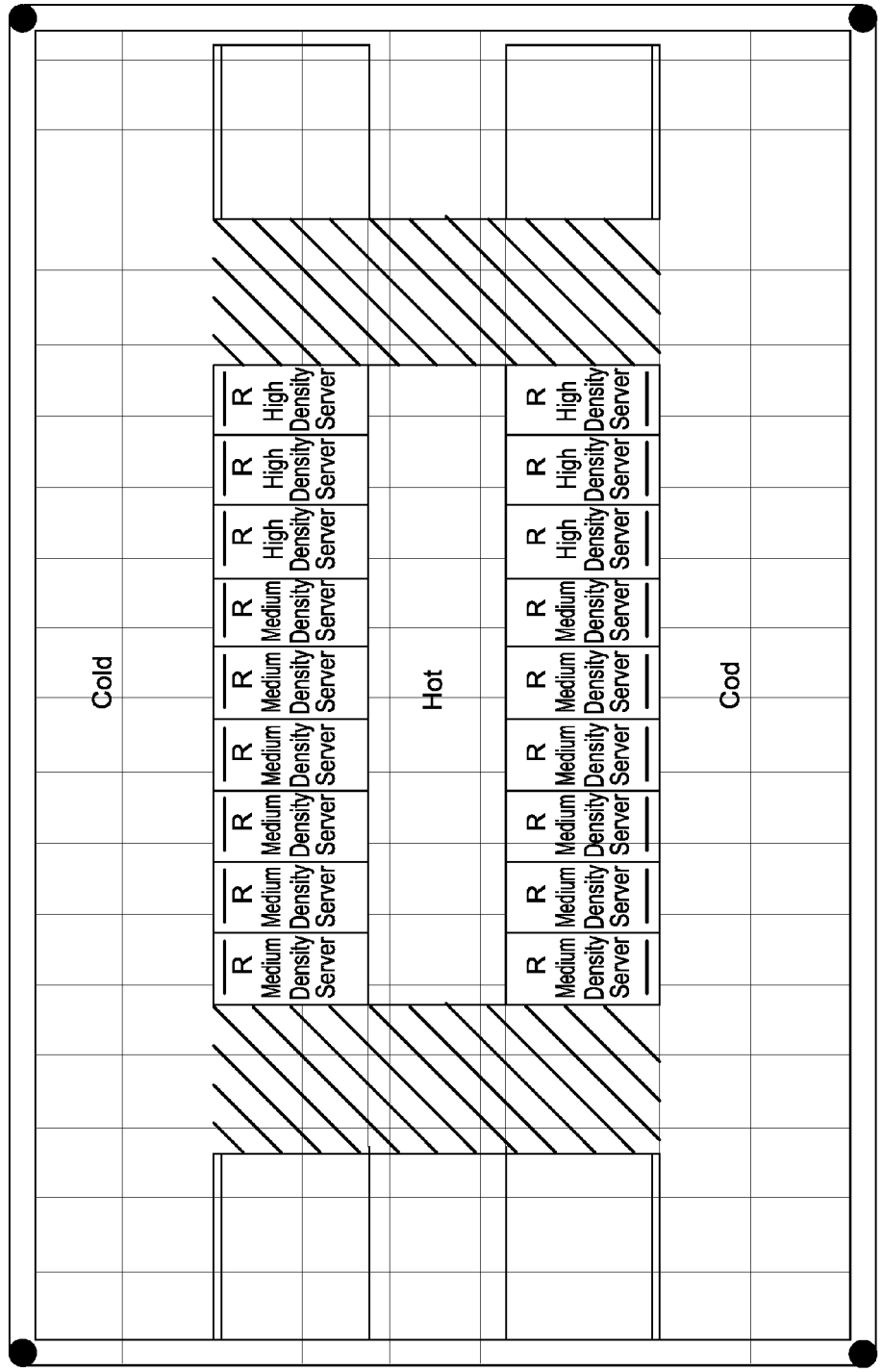
FIG. 6 is a floor plan illustrating an example layout to which aspects of an embodiment are applied.

The basic method is now illustrated by an example of automatically placing over-aisle cooling units in a sample layout. The layout is a cluster with 12 medium density (4 kW) racks and 6 high density (8 kW) racks, as shown in FIG. 6. An algebraic calculator is used to estimate capture index for each rack within the layout and place each cooling unit to minimize the weighted total escaped power at each stage. The desired result is a layout with N+1 redundancy. Thus, the stopping condition is N+1 redundant cooling.

Figure 7:
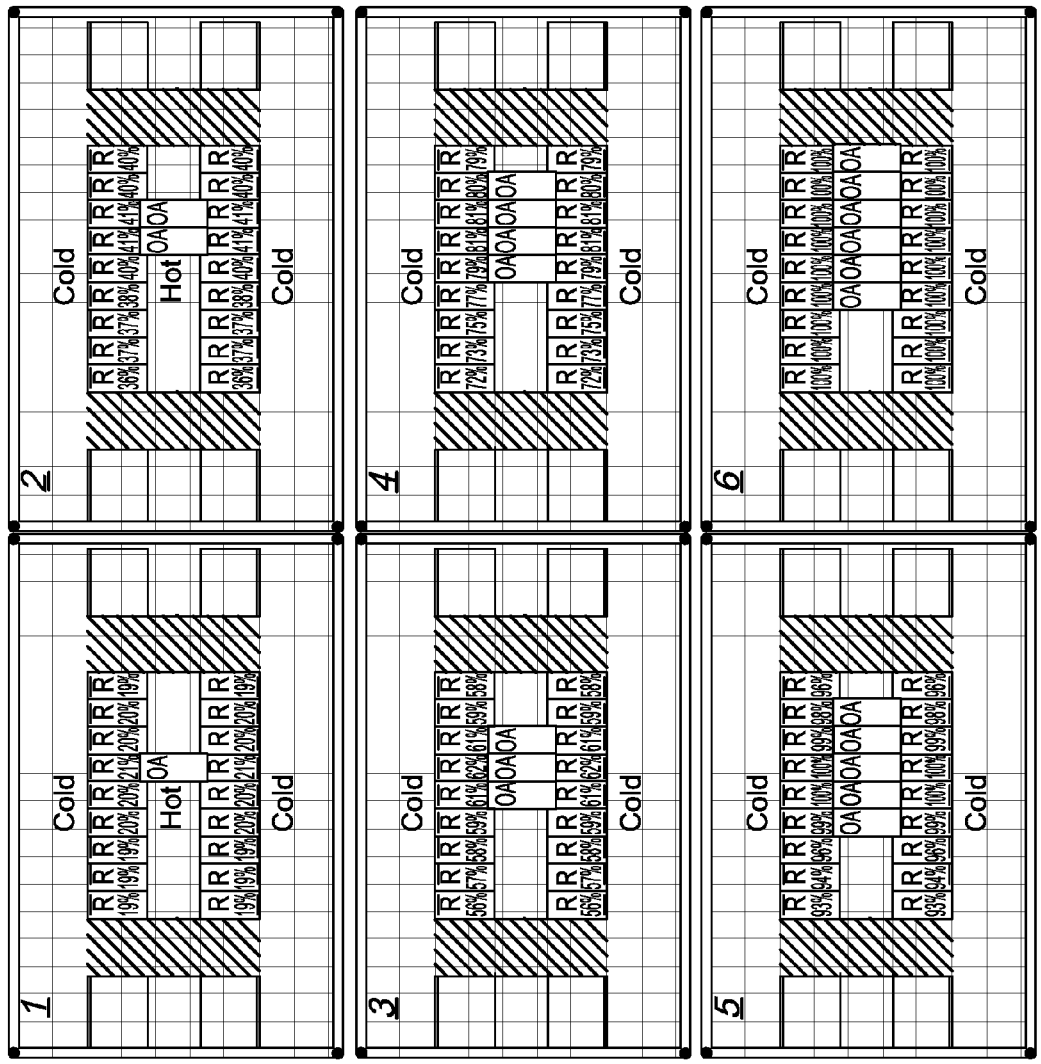
FIG. 7 is a mosaic of six snapshots showing the result after each of six stages of applying aspects of an embodiment.

FIG. 7 shows six floor plan snapshots illustrating the results of performing six cooler placement stages according to aspects of the illustrative embodiment, with the final result being a layout with N+1 redundancy. The cooler to be added at each stage is tested in all of the available positions, roughly corresponding to each empty space in the aisle across from two racks. Each cooler is placed, one at a time, into the best possible location available at that stage. When five coolers have been placed, as shown in FIG. 7 snapshot 5, every rack is adequately cooled when measured by the metric of CI. When six coolers have been placed, as shown in FIG. 7 snapshot 6, every rack has N+1 redundant cooling. The process then stops because the stopping condition of N+1 redundant cooling has been met for every rack.

This example uses a stage size of 1, and so the method of FIG. 4 may be followed. Of course, a larger stage size and backtracking, as described in connection with FIG. 5 could also have been followed, had the initial conditions have suggested to the skilled designer that such an approach would have been suitable.

This example illustrates the sequential nature of the method and shows how stopping conditions are satisfied, but also highlights its ability to perform placement of new cooling technology. Provided the new technology is modeled using CFD or an algebraic calculator, an auto-placement method embodying aspects of the invention can perform such placement of cooling elements into a layout.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-implemented method for sequential placement of cooling resources in a data center model, the method comprising:

defining a weighted, higher-order cooling metric, $\hat{M}$, representing an overall performance of the cooling resources in the data center model, $\hat{M}$ being based on a calculation of at least one performance metric M, wherein k cooling resources having greater impact on M than other cooling resources are omitted from the calculation;

enumerating all possible locations in the data center model for placing an additional c cooling resources; and placing the c cooling resources in locations in the data center model for which $\hat{M}$ is closest to an optimum value.

2. The method of claim 1, further comprising:

defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the data center model, C represents a total number of cooling resources placed in the data center model, i represents one of the R racks in the data center model, $M_i^{(k)}$ represents a value of metric $M_i$ when k cooling resources are shut down, and a(i,k) is a weighting function for rack i with the k cooling resources shut down.

3. The computer-implemented method of claim 1, further comprising:

repeating enumerating and placing until a desired stopping condition is met by a resulting placement of cooling resources.

4. The computer-implemented method of claim 3, wherein the stopping condition is a desired redundancy level.

5. The computer-implemented method of claim 3, further comprising:

testing whether the desired stopping condition is met by a new resulting placement of cooling resources after removing one cooling resource from the resulting placement of cooling resources.

6. The computer-implemented method of claim 5, further comprising:

identifying that cooling resource which when removed results in a value of $\hat{M}$ closest to an optimum value; and removing that cooling resource identified.

7. The computer-implemented method of claim 2, wherein $M_i$ is capture index.

8. A system for sequential placement of cooling resources in a data center layout, comprising:

a computer storage system in which is stored a database holding a numerical computer model of the data center layout; and a computer processor executing a sequence of instructions directing:

defining a weighted, higher-order cooling metric, $\hat{M}$, representing an overall performance of the cooling resources in the computer model of the data center layout, $\hat{M}$ being based on a calculation of at least one performance metric M, wherein k cooling resources having greater impact on M than other cooling resources are omitted from the calculation;

enumerating all possible locations in the computer model of the data center layout for placing an additional c cooling resources; and placing the c cooling resources in locations in the computer model of the data center layout for which $\hat{M}$ is closest to an optimum value.

9. The system of claim 8, wherein defining further comprises:

defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the computer model of the data center layout, C represents a total number of cooling resources placed in the computer model of the data center layout, i represents one of the R racks in the computer model of the data center layout, $M_i^{(k)}$ represents a value of metric M, when k cooling resources are shut down, and a(i,k) is a weighting function for rack i with the k cooling resources shut down.

10. The system of claim 8, the sequence of instructions further comprising:

repeating enumerating and placing until a desired stopping condition is met by a resulting placement of cooling resources.

11. The system of claim 10, wherein the stopping condition is a desired redundancy level.

12. The system of claim 10, the sequence of instructions further comprising:

testing whether the desired stopping condition is met by a new resulting placement of cooling resources after removing one cooling resource from the resulting placement of cooling resources.

13. The system of claim 12, the sequence of instructions further comprising:

identifying that cooling resource which when removed results in a value of M closest to an optimum value; and removing that cooling resource identified.

14. A non-transitory computer-readable medium having stored thereon sequences of instructions for sequentially placing cooling resources in a data center model, the sequences of instructions including instructions that will cause at least one processor to:

define a weighted, higher-order cooling metric, $\hat{M}$, representing an overall performance of the cooling resources in the data center model, $\hat{M}$ being based on a calculation of at least one performance metric M, wherein k cooling resources having greater impact on M than other cooling resources are omitted from the calculation;

enumerate all possible locations in the data center model for placing an additional c cooling resources; and place the c cooling resources in locations in the data center model for which $\hat{M}$ is closest to an optimum value.

15. The non-transitory computer-readable medium of claim 14, wherein defining further comprises:

defining the higher-order cooling metric, $\hat{M}$, in terms of a cooling index $M_i$, such that $$\hat{M} = \sum_{k=0}^{C-1} \sum_{i=1}^{R} a(i,k) M_i^{(k)},$$

where R represents a number of racks in the data center model, C represents a total number of cooling resources placed in the data center model, i represents one of the R racks in the data center model, $M_i^{(k)}$ represents a value of metric $M_i$ when k cooling resources are shut down, and a(i,k) is a weighting function for rack i with the k cooling resources shut down.

16. The non-transitory computer-readable medium of claim 14, the sequences of instructions further causing the processor to:

repeat enumerating and placing until a desired stopping condition is met by a resulting placement of cooling resources.

17. The non-transitory computer-readable medium of claim 16, wherein the stopping condition is a desired redundancy level.

18. The non-transitory computer-readable medium of claim 16, the sequences of instructions further causing the processor to test whether the desired stopping condition is met by a new resulting placement of cooling resources after removing one cooling resource from the resulting placement of cooling resources.

19. The non-transitory computer-readable medium of claim 18, the sequences of instructions further causing the processor to:

identify that cooling resource which when removed results in a value of $\hat{M}$ closest to an optimum value; and remove that cooling resource identified.

20. The non-transitory computer-implemented method of claim 15, wherein $M_i$ is a capture index metric.

* * * * *